United States Patent [19]

Tone et al.

[11] Patent Number: 4,523,122

[45] Date of Patent: Jun. 11, 1985

[54] PIEZOELECTRIC ULTRASONIC TRANSDUCERS HAVING ACOUSTIC IMPEDANCE-MATCHING LAYERS

[75] Inventors: Masayuki Tone; Tsutomu Yano, both of Kawasaki; Koetsu Saito, Sagamihara, all of Japan

[73] Assignee: Matsushita Electric Industrial Co., Ltd., Japan

[21] Appl. No.: 590,465

[22] Filed: Mar. 16, 1984

[30] Foreign Application Priority Data

| | | | |
|---|---|---|---|
| Mar. 17, 1983 | [JP] | Japan | 58-44946 |
| Mar. 17, 1983 | [JP] | Japan | 58-44947 |
| Nov. 4, 1983 | [JP] | Japan | 58-207909 |

[51] Int. Cl.[3] .......... H01L 41/08

[52] U.S. Cl. .......... 310/334; 310/335; 310/336; 310/327; 367/152; 73/644

[58] Field of Search .......... 310/334, 335, 336, 337, 310/326, 327; 73/642, 644; 367/152, 157, 165

[56] References Cited

U.S. PATENT DOCUMENTS

| | | | |
|---|---|---|---|
| 3,394,586 | 7/1968 | Cross | 73/644 |
| 3,663,842 | 5/1972 | Miller | 73/644 X |
| 3,674,945 | 7/1972 | Hands | 310/334 X |
| 3,678,737 | 7/1972 | Miller | 310/336 X |
| 3,732,444 | 5/1973 | Miller | 310/336 X |
| 3,883,841 | 5/1975 | Norel et al. | 310/336 X |
| 4,211,948 | 7/1980 | Smith et al. | 310/334 X |
| 4,366,406 | 12/1982 | Smith et al. | 310/334 |

OTHER PUBLICATIONS

Fukumoto et al., "National Technical Report", vol. 29, No. 1(1983), p. 179.

*Primary Examiner*—Mark O. Budd

*Attorney, Agent, or Firm*—Lowe, King, Price & Becker

[57] ABSTRACT

Ultrasonic transducers comprising an ultrasonic transducer element, a pair of electrodes provided on opposite sides of the element, and an acoustic impedance-matching layer formed on an ultrasonic wave-radiating surface of the element through one electrode. The acoustic impedance-matching layer is made of a porous polymer film or a composite material comprising thermally expanded resin microspheres dispersed in a cured product of thermosetting resin and has an acoustic impedance not larger than $0.6\times10^6$ Ns/m$^3$. Two-layer constructions may also be used as the acoustic impedance-matching layer.

26 Claims, 14 Drawing Figures

PIEZOELECTRIC ULTRASONIC TRANSDUCERS HAVING ACOUSTIC IMPEDANCE-MATCHING LAYERS

BACKGROUND OF THE INVENTION

1. Field of the Invention

This invention relates to ultrasonic transducers for use in noncontacting distance measurement and profile detection systems for any solid object in air.

2. Description of the Prior Art

As is well known, piezoelectric ceramic transducer elements or magnetostriction transducer elements have been used in ultrasonic air transducer arrays. These elements may be broadly divided into three types with respect to construction.

In one such construction, a piezoelectric or magnetostriction transducer element is integrally combined with a metallic horn at one end, which is in turn combined with a metallic vibrator plate of a relatively large area at the other end of the horn. The use of the metallic vibrator plate of a relative large area serving as an ultrasonic radiating surface enables one to achieve, to an extent, an acoustic impedance-match between the piezoelectric or magnetostriction transducer element and the air.

Another type of construction comprises a bimorph piezoelectric transducer element capable of flexural vibrations and a thin aluminium cone connected to the transducer element through a bar. The transducer is so designed as to match the acoustic impedance between the piezoelectric transducer element and the air with the aid of the cone.

In the above prior art transducers, the flexural vibrations of the metallic vibrator plate or the bimorph piezoelectric transducer or the cone are utilized and thus it is almost impossible to raise the resonance frequency. These types of transducers have been ordinarily used only to generate ultrasonic waves in air below 100 kHz. Such a relatively long wavelength in air is not satisfactory for distance or azimuth resolution or profile or nature resolution.

Moreover, these known transducers make use of the flexural vibrations and have a difficulty in phase control of ultrasonic wave radiated into the air. This leads to the difficulty in controlling the directivity of the ultrasonic beam.

A further transducer makes use of thickness vibrations of a piezoelectric transducer element. The transducer element has an acoustic impedance-matching layer on the ultrasonic wave transmitting front surface thereof. On the back surface of the element is formed a backing layer. In order to match the acoustic impedance between the piezoelectric transducer element and the air, the matching layer is made of a composite material comprising an epoxy resin or silicone resin matrix and microspheres of glass having a diameter of several hundreds microns or below.

As regards the magnitude of acoustic impedance, when a PZT piezoelectric ceramic is applied as the transducer element, the sound velocity, $v_1$, of the element is about 3500 m/sec., and the density, $\rho_1$, is about 8000 kg/m$^3$. The acoustic impedance, $Z_1$, represented by the product of the sound velocity and the density is about $3\times10^7$ Ns/m$^3$. On the other hand, the acoustic impedance, $Z_2$, of air at a normal temperature is about 400 Ns/m$^3$. With the construction using only one impedance-matching layer, the acoustic impedance-matching layer should have an acoustic impedance, $Z_m$, $$Z_m = \sqrt{Z_1 Z_2} \tag{1}$$

That is, $Z_m = 0.11\times10^6$ Ns/m$^3$. In the case, the acoustic impedance-matching layer has preferably substantially a quarter wavelength thickness.

The acoustic impedances of conventionally used silicone and epoxy resins are, respectively, $1.0\times10^6$ Ns/m$^3$ and $3.0\times10^6$ Ns/m$^3$. These values are larger by one order of magnitude than the acoustic impedance obtained from the equation (1). Satisfactory matching between the element and the air cannot be achieved, so that the sensitivity of the transducer lowers.

With the acoustic impedance-matching layer in which hollow microspheres of glass are distributed throughout a synthetic resin matrix, the density, $\rho_g$, of the glass microspheres is about 300 kg/m$^3$ and the density, $\rho_o$, of the resin matrix is about 1000 kg/m$^3$ when using silicone resin. When the weight ratio of charged hollow glass microspheres is taken as $r_m$, the density, $\rho$, of the resulting composite material is expressed by the following equation (2)

$$\rho = \frac{\rho_g \rho_o}{(1 - r_m)\rho_g + r_m \rho_o} \tag{2}$$

The density, $\rho$, in relation to $r_m$ varies as shown by the solid line curve of FIG. 1. In the figure, indicated by a broken line curve is the relation between the weight ratio and the volume ratio, $r_v$, of the hollow glass microspheres in the total composite material. The volume ratio, $r_v$ is represented by the following equation (3)

$$r_v = \frac{r_m \rho_p}{(1 - r_m)\rho_g + r_m \rho_o} \tag{3}$$

As will be seen from the figure, when the weight ratio of the microspheres is, for example, 0.30, the volume ratio is 0.59. The composite material comprising such microspheres has a density of 590 kg/m$^3$. An increased value of $r_m$ results in a smaller density, $\rho$, of the composite material with an increased volume ratio, $r_v$, of the microspheres being charged. Uniform mixing and charging of the microspheres is thus difficult.

Hollow microspheres of glass having a density of 300 kg/m$^3$ are mixed with a silicone resin having a density of 1000 kg/m$^3$ in different ratios to determine a density and sound velocity thereof. The results are shown in Table 1 below.

| Weight Ratio of Hollow Glass Microspheres | Density of Mixture | Sound Velocity of Mixture | Acoustic Impedance |
|---|---|---|---|
| 0.15 | 740 kg/m$^3$ | 1300 m/sec. | $0.96\times10^6$ Ns/m$^3$ |
| 0.30 | 670 kg/m$^3$ | 1500 m/sec. | $1.01\times10^6$ Ns/m$^3$ |

As will be seen from Table 1, an increased weight ratio of the microspheres is not so effective in lowering the acoustic impedance. More particularly, the acoustic impedance values of the composite materials are larger by one order of magnitude than the acoustic impedance calculated from the equation (1), i.e. $0.11\times10^6$ Ns/m$^3$.

Thus, such composite materials are not suitable when applied as an acoustic impedance-matching layer.

Ultrasonic transducers comprising two impedance matching layers are known for use in medical ultrasound examinations. The guiding principle in the design of such ultrasonic transducers has been reported, for example, by Fukumoto et al ("National Technical Report", Vol. 29, No. 1 (1983), p. 179). In this report, acoustic impedances necessary for the respective impedance-matching layers are determined based on analytical and numerical techniques using the respective two equations. For instance, when a PZT piezoelectric ceramic transducer element is used, the first acoustic impedance-matching layer on the element surface and the second impedance-matching layer on the first layer are determined, according to the respective equations, to have acoustic impedances of $1.8\times10^6$ Ns/m$^3$ and $6.9\times10^3$ Ns/m$^3$, or $0.25\times10^6$ Ns/m$^3$ and $2\times10^3$ Ns/m$^3$.

However, materials for existing impedance-matching layers have an acoustic impedance of at most $0.9\times10^6$ Ns/m$^3$. Thus, the above requirement for the ultrasonic air transducer comprising two matching layers cannot be satisfied.

SUMMARY OF THE INVENTION

It is an object of the invention to provide ultrasonic transducers which comprise an acoustic impedance-matching layer or layers having an optimum acoustic impedance for achieving a match between a piezoelectric transducer or magnetostriction element and air.

It is another object of the invention to provide ultrasonic transducers in which ultrasonic signals can be transmitted in high efficiency and/or received at high sensitivity.

It is a further object of the invention to provide ultrasonic transducers which are suitable for distance and profile measurements by transmitting ultrasonic wave into air and receiving a reflected wave from an object in the air.

It is a specific object of the invention to provide an ultrasonic transducer which comprises a specific combination of two acoustic impedance-matching layers having specific ranges of acoustic impedances, respectively, whereby ultrasound signals of good pulse response characteristic are transmittable in high efficiency and receivable in high sensitivity over a wide range of high frequency.

The present invention provides an ultrasonic transducer which comprises an ultrasonic transducer element, an electrode provided on opposite sides of the element, and an acoustic impedance-matching layer formed on an ultrasonic wave radiating surface of the element through one electrode, characterized in that the acoustic impedance-matching layer has an acoustic impedance not larger than $0.6\times10^6$ Ns/m$^3$.

One preferred broadband impedance-matching layer is made of a perforated polymer film having a uniform thickness of approximately one-quarter wavelength at the emission frequency.

Another type of impedance-matching layer comprises a polymer matrix dispersing therein thermally expanded hollow microspheres made of a resin. The thermally expanded hollow microspheres may be distributed throughout the resin matrix such that the size of the microspheres decreases towards the direction of the interface between the impedance-matching layer and the the transducer element.

A further type includes two acoustic impedance-matching layers. The first layer is formed on the front surface of a transducer element, on which is further formed a second layer. When the acoustic impedances of the first and second layers are taken $X\times10^6$ Ns/m$^3$ and $Y\times10^6$ Ns/m$^3$, respectively $1.5\leqq X\leqq 7.2Y+4.9$ and $0.08\leqq Y\leqq 0.6$.

DETAILED DESCRIPTION AND PREFERRED EMBODIMENTS OF THE INVENTION

Figure 1:
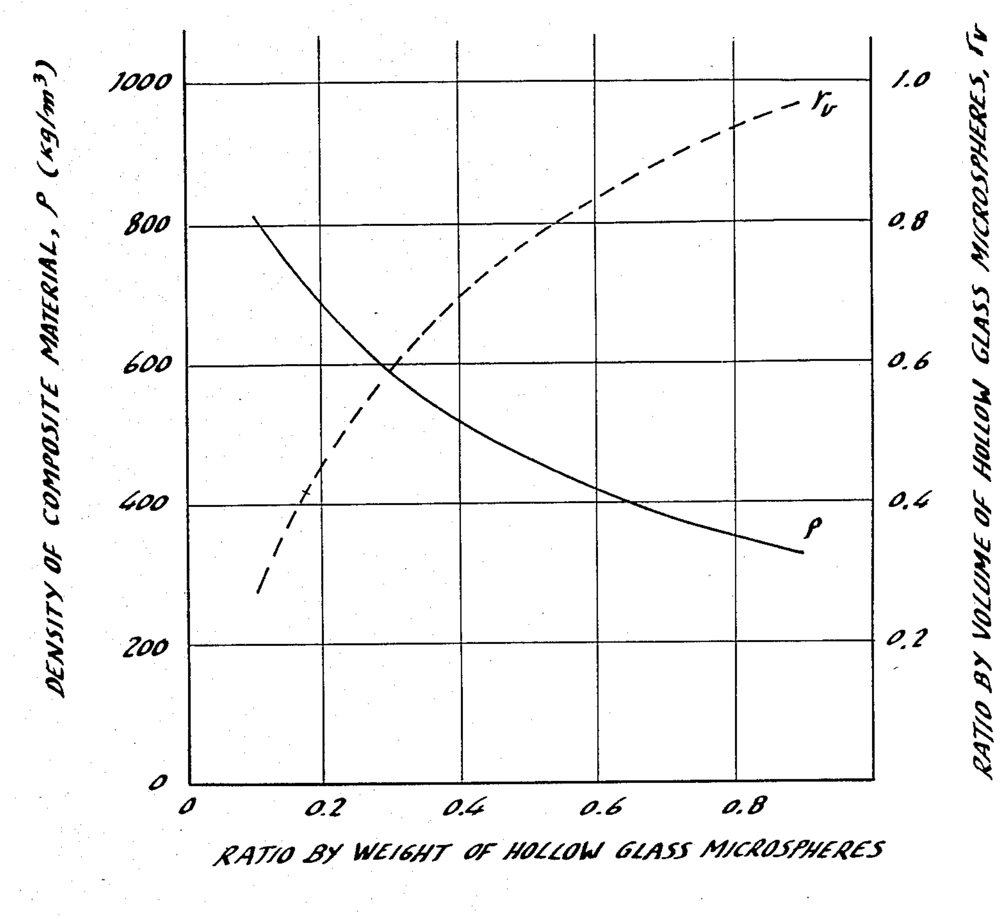
FIG. 1 is a graph showing the relation between density of a composite material of silicone resin and hollow glass microspheres and weight ratio of the microspheres and also the relation between the weight and volume ratios.
Figure 2:
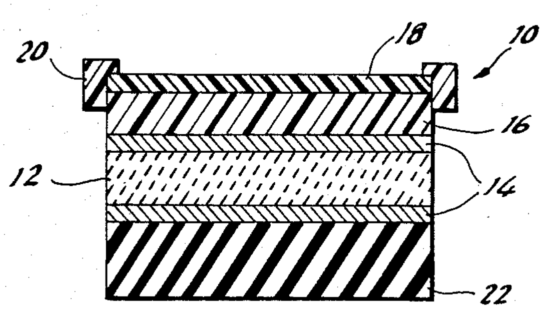
FIG. 2 is a schematic sectional view of a fundamental arrangement of a transducer according to the invention.

Referring now to the accompanying drawings in which like parts are indicated by like reference numerals and particularly to FIG. 2, there is generally shown a transducer 10 which includes a transducer element 12 having a metallic coating 14 on opposite sides thereof serving as electrodes. On the surface of one electrode 14 is formed an acoustic impedance-matching layer 16. The layer 16 may be covered with a protective film 18 of a synthetic resin such as polyethylene terephthalate, polypropylene, polyimide or the like as will be described hereinafter. If the protective film 18 is used, a keep frame 20 may be provided in order to bring the film 18 into intimate contact with the layer 16. On the back of the the transducer element 14 may also be formed a backing member through the other electrode 14.

The transducer element 12 is made of a piezoelectric ceramic such as lead titanate, zirconia or the like, or a magnetostriction ferrite material in the form of a slab. The slab may be purchased as having the correct thickness or lapped from a slightly thick slab. Metallic coatings are applied as usual on the opposite surfaces of the element 12 to provide the electrodes 14. Such coatings may be formed by coating or vacuum evaporation as is well known in the art.

The acoustic impedance-matching layer 16 is bonded to the electrode 14 by any known manner. This layer 16 should conveniently have a thickness of approximately one quarter wavelength or odd harmonics at the frequency emitted therethrough. The thickness may not always be exactly of one quarter wavelength or odd harmonics but may differ from such values by plus or minus 20% or below. In practice, the transducer of the invention is operable in a wide frequency range from 100 kHz to 2 MHz and the thickness may actually range from 0.05 to 1.50 mm.

The backing member may be made of any known materials such as tungsten-epoxy composite material, ferrite-rubber composite material or the like as usually employed for the purpose of ultrasonic attenuation.

The most important feature of the invention resides in the fact that an acoustic impedance of the layer 16 is not larger than $0.6\times10^6$ Ns/m$^3$.

Figure 3:
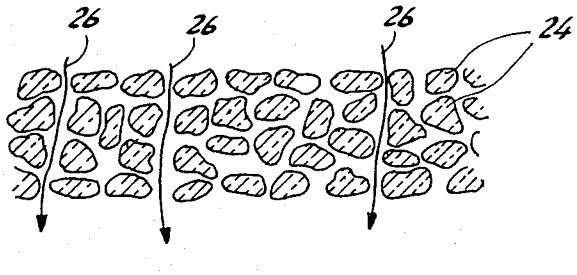
FIG. 3 is a schematic enlarged view, in section, showing an impedance-matching layer of a porous polymer film according to one embodiment of the invention.

This may be achieved, according to one embodiment of the invention, by an acoustic impedance-matching layer which is made of a porous polyolefin film having a porosity ranging from 50 to 90%. Such porous polyolefin films are commercially sold under the name of Hipore 1000, 2000 or 3000 from Asahi Chem. Co., Ltd. Japan. The micropore structure of the porous polyolefin film is particularly shown in FIG. 3. In the figure, the layer 16 has a polyolefin matrix 24 and continuous pores 26. An acoustic impedance not larger than $0.6\times10^6$ Ns/m$^3$ is readily obtained using such porous film having a porosity ranging from 50 to 90%. Typical polyolefins used are polyethylene, polyprpylene and the like.

Figure 4:
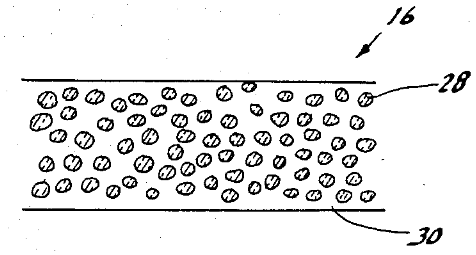
FIG. 4 is a schematic enlarged view, in section, showing another type of impedance-matching layer of the transducer made of a composite material according to the invention.

Alternatively, the acoustic impedance-matching layer may be made of a resin matrix dispersing therein thermally expanded resin microspheres or microballoons as shown in FIG. 4. In the figure, the layer 16 has a large number of microballoons 28 dispersed in a resin matrix 30 as shown. The resin matrix 30 is, for example, a cured product of thermosetting silicone resin or epoxy resin. The resin microballoons may be dispersed in the resin matrix to have a desired size. More particularly, thermally expansible microspheres each of which has a spherical plastic shell and a low boiling hydrocarbon such as iso-butane contained in the sphere are mixed with a fluid thermosetting resin. The mixture is formed into a film by casting or other suitable techniques and heated to about 100° C. for a time sufficient to expand the microspheres to a desired extent. The plastic shell of the microspheres is typically made of a vinylidene chloride copolymer with acrylonitrile. Such microspheres containing low boiling hydrocarbon are commercially available, for example, from Kemanord Co., Ltd. under the name of Expancel.

The thermally expansible microspheres have usually a diameter of about 5 to 30 prior to thermal expansion and when heated to about 100° C., they are expanded to a level of several to several tens times as larger in volume. The expansion rate may, of course, depend on the heating conditions.

The fluid thermosetting synthetic resin used as the matrix should have a viscosity below 100 centipoises at a normal temperature because too high a viscosity makes it difficult to mix thermally expansible microspheres in relatively large amounts. For example, when the viscosity is over 100 centipoises, the possible weight ratio of the microspheres being admixed is at most 10%. Accordingly, the density of the resulting composite material does not lower as desired. The thermosetting resin is cured by heating for the expansion of thermally expansible resin mirospheres.

Figure 5:
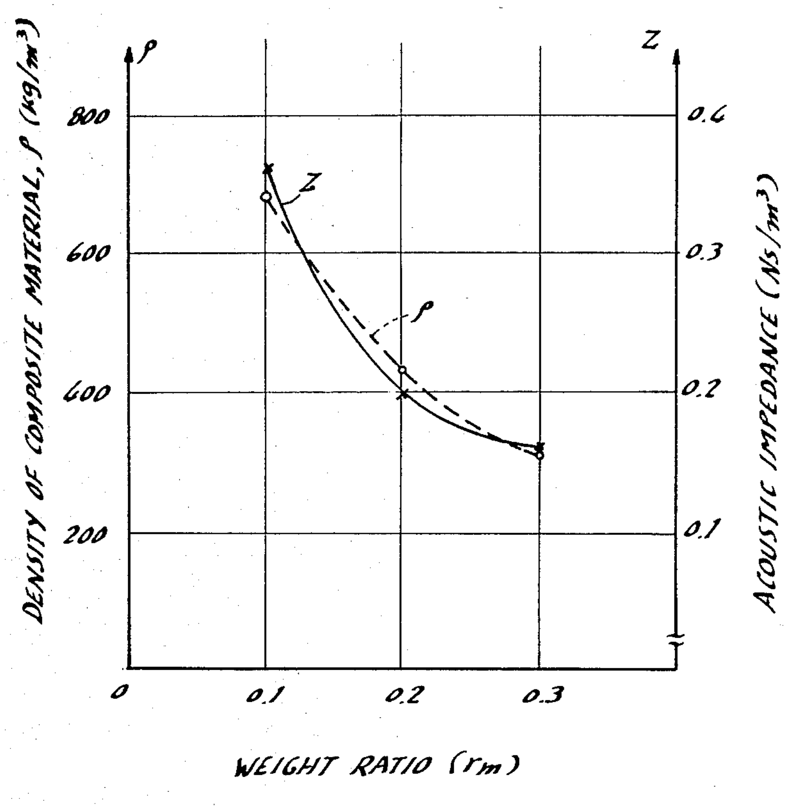
FIG. 5 is a graph showing the relation between density or acoustic impedance of the composite material for the matching layer of FIG. 4 and ratio by weight of hollow microspheres of a synthetic resin.

The density and acoustic impedance of the composite material having thermally expanded microspheres dispersed in the silicone resin matrix are measured in different ratios by weight of the microspheres added prior to the thermal expansion treatment. The thermal expansible microspheres are expanded by heating to 115° C. for 30 minutes. The results are shown in FIG. 5. Moreover, a mixture of 80 wt% of silicone resin and 20 wt% of microspheres of the type mentioned above is heated at different temperatures for 30 minutes and subjected to the measurement of density and acoustic impedance with the results shown in FIG. 6.

Figure 6:
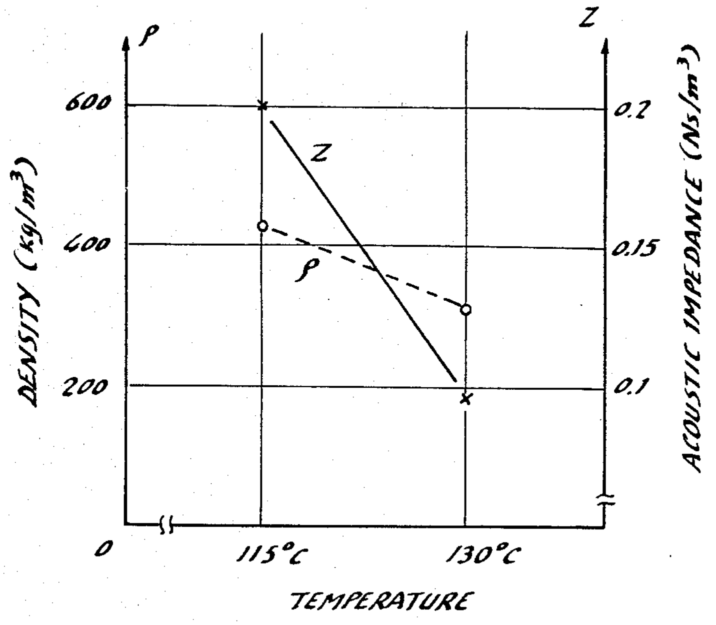
FIG. 6 is a graph showing the relation between density or acoustic impedance of a composite material and heating temperature.

The results of FIG. 5 reveal that the content of the microspheres ranging from 10 to 30 wt% ensures an acoustic impedance below $0.36\times10^6$ Ns/m$^3$ and that an acoustic impedance is as low as $0.16\times10^6$ Ns/m$^3$ in a ratio by weight of 0.3. This value is very close to the acoustic impedance value of $0.11\times10^6$ Ns/m$^3$ which is ideally required for the acoustic impedance-matching layer intermediate between transducer and air. FIG. 6 gives evidence that the acoustic impedance can be reduced to as low as $0.098\times10^6$ Ns/m$^3$ at elevated temperatures of about 130° C. even when the ratio by weight of the thermally expansible microspheres is 0.2.

In view of the above and further confirmation tests made by us, it was found that the ratio by weight of the microspheres to the resin matrix is in the range of 0.05 to 0.4:1. Within such range, the acoustic impedance is controlled to be lower than $0.6\times10^6$ Ns/m$^3$. Usually, the heating temperature of from 90° to 135° C. and the heating time of from 10 to 60 minutes are used, within which proper time and temperature conditions should be selected in consideration of a desired expansion rate and for complete curing. Silicone and epoxy resins useful in the present invention should be fluid prior to curing and have a suitable range of viscosity sufficient to allow uniform dispersion of microspheres prior to curing.

The above type of impedance-matching layer is advantageous in that the size of the microballoons or thermally expanded hollow microspheres is arbitrarily controlled by controlling the heating temperature and time. If the size of microballoons in the layer is not sufficiently small as compared to the wavelength of an ultrasonic wave transmitted through the layer, the ultrasonic wave is greatly attenuated in the layer. This is suitably overcome by proper control of the size.

The minimum acoustic impedance attained by dispersion of the thermally expanded resin microspheres or microballoons in the resin matrix is found to be about $0.08\times10^6$ Ns/m$^3$.

The acoustic impedance-matching layer having a thickness of approximately one quarter wavelength or harmonics thereof at the emission frequency is bonded to a transducer element of either a piezoelectric ceramic or a magnetostriction material through a metallic electrode.

Figure 7:
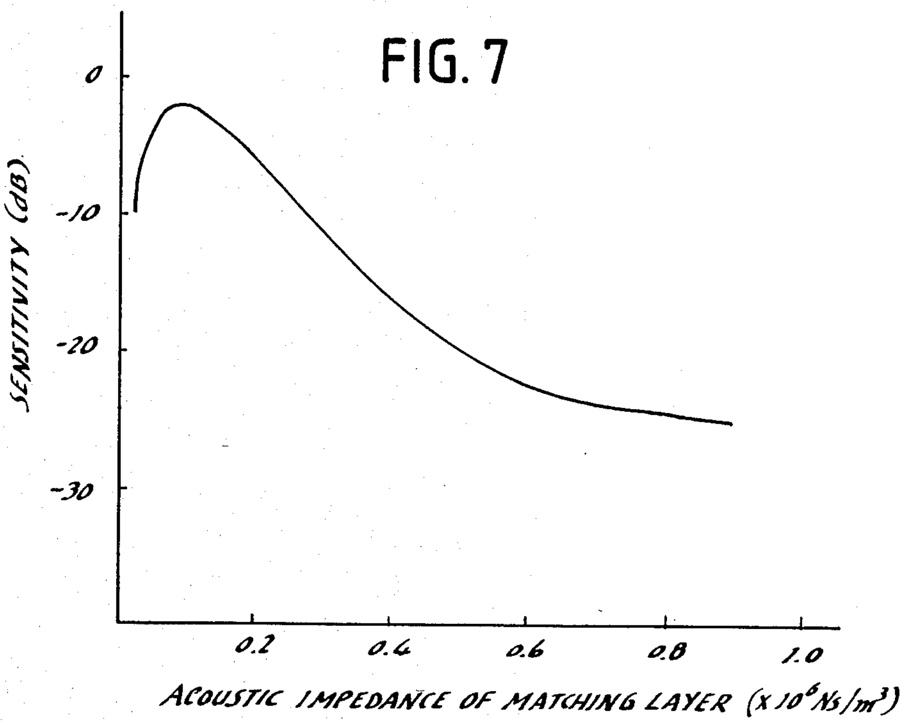
FIG. 7 is a graph showing the results of simulation of sensitivity in relation to acoustic impedance of an acoustic impedance-matching layer.

In FIG. 7, there are shown the results of simulation of sensitivity to reflected wave in relation to acoustic impedance, $Z_m$, of acoustic impedance-matching layer. The sensitivity at an acoustic impedance larger than $0.6\times10^6$ Ns/m$^3$ is lower by at least 20 dB than a maximum value attained at $Z_m=0.11\times10^6$. Thus, the effect of improving the sensitivity by the use of the acoustic impedance-matching layer having such a high acoustic impedance is not significant. In the practice of the invention, the acoustic impedance-matching layer should have an acoustic impedance not larger than $0.6\times10^6$ Ns/m$^3$.

Figure 8:
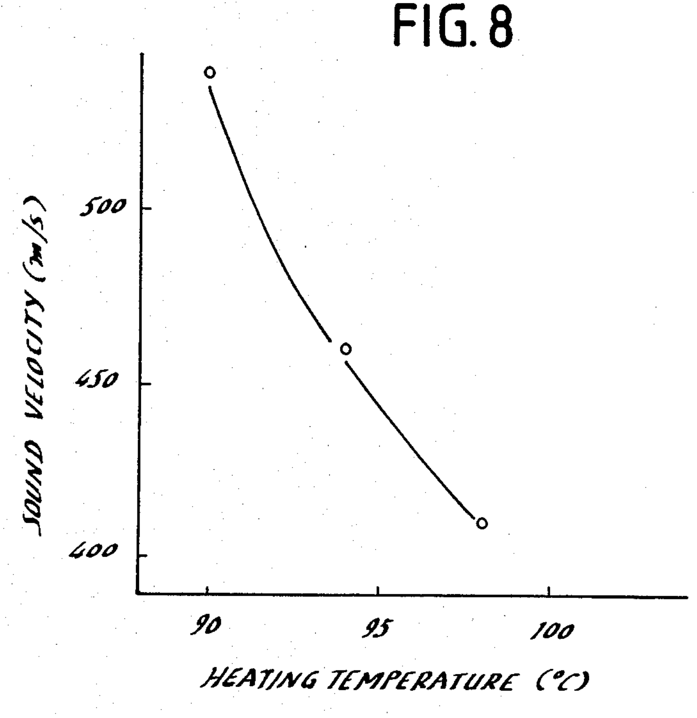
FIG. 8 is a graph showing the relation between sound velocity and heating temperature of a composite material for the matching layer.

As is known, the sound velocity depends largely on the temperature. For instance, thermally expensible microspheres are uniformly mixed with silicone resin in a weight ratio of 0.3 and heated to about 100° C. for 30 minutes. The resulting composite material is cooled to a normal temperature. The sound velocity of such material in relation to temperature has such a tendency as shown in FIG. 8. For instance, the thickness of an acoustic impedance-matching layer is determined as a quarter wavelength at the frequency used on the basis of the sound velocity of composite material at a given heating temperature. In this case, when the heating temperature fluctuates from the given temperature, the sound velocity changes. This may result in a layer thickness which differs relatively largely from one quarter wavelength. Thus, the matching requirement cannot be satisfied. Moreover, as will be seen from FIG. 6, the acoustic impedance of the composite material varies depending on the heating temperature, the matching condition of the equation (1) may not be satisfied.

In addition, thermally expansible microspheres in resin matrix which are heated to uniformly expand in the matrix may cause the resulting thin layer irregular on the surfaces thereof. This is rather disadvantageous in bonding of the layer is bonded to a transducer element.

One modification of the acoustic impedance-matching layer discussed above is to distribute resin microballoons throughout the resin matrix in such a way that the size of distributed microballoons in the layer is continuously changed along the radiation direction of ultrasonic wave. This leads to a continuous change of the acoustic impedance or sound velocity of the matching layer with respect to the propagating direction of ultrasound wave. By this arrangement, the fluctuation in matching condition which is based on the variation of the acoustic impedance or sound velocity resulting from the variation of the heating temperature of the composite material for use as acoustic impedance-matching layer is absorbed, thus the broadband transmission and detection service being realized. Because thermally expansible microspheres are heated so that the size of expanded microspheres continuously decreases towards the direction of the interface between the matching layer and the transducer element. The matching layer is kept relatively smooth on one surface thereof even after the expansion of the microspheres. This assures complete adhesion of the surface to the transducer element.

Figure 9:
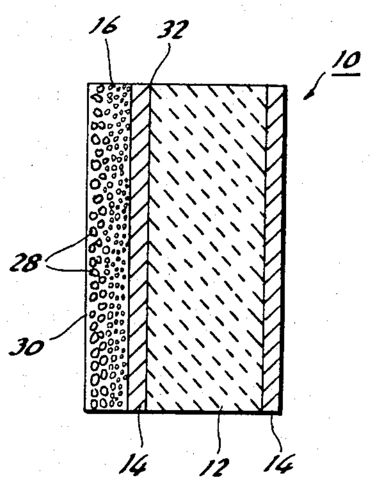
FIG. 9 is a schematic sectional view showing a further embodiment of the invention.

This modification is particularly illustrated in FIG. 9. The transducer 10 of FIG. 9 is depicted to have only the transducer element 12, a pair of electrodes and the acoustic impedance-matching layer 16. The layer 16 has a multitude of microballoons 28 which are distributed throughout the layer and whose size decreases towards the element 12 as shown. In other words, the layer 16 is bonded through one electrode to a ultrasonic wave radiation surface 32 of the element 12 such that the size of the microballoons is distributed to increase toward the radiating direction of ultrasonic wave.

Because the size of the microballoons increases with an increase of heating temperature, the sound velocity and acoustic impedance of this type of layer continously decreases along the wave-radiating direction. Accordingly, it becomes possible to acoustically match the transducer element 12 and air serving as an ultrasonic propagation medium over a wide range of frequency.

Figure 10:
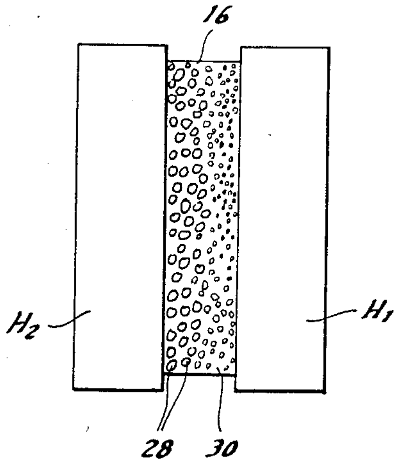
FIG. 10 is a schematic sectional view showing the manner of fabricating the matching layer of FIG. 9.

Fabrication of the acoustic impedance-matching layer of FIG. 9 in which the microballoons 28 are distributed in the order of size is illustrated in FIG. 10.

A composite material or mixture of thermally expansible resin microspheres and a synthetic resin such as a thermosetting silicone or epoxy resin is placed, as layer 16, between heat plates $H_1$ and $H_2$ having temperatures of $T_1$ and $T_2$, respectively, provided that $T_1<T_2$. As a result, the layer 16 is heated to have a temperature gradient by which the size of the resulting expanded hollow microspheres in the layer 12 may be continuously changed as desired. In practice, the higher temperature, $T_2$, is generally in the range of 110° to 130° C. and the lower temperature, $T_1$, is in the range of 90° to 110° C. The heating time may depend on the temperatures used and is usually in the range of 20 to 60 minutes. The acoustic impedance-matching layer having such a size distribution as described above is very smooth on one surface thereof which is contacted with the heat plate $H_1$ of the lower temperature. This permits easy bonding of the surface to the electrode.

Another modification is to thermally expand the expansible microspheres to a desired extent prior to mixing with thermosetting resin. Thermally expansible microspheres of the type mentioned before are first heated within a temperature range defined before to have a density of 20 kg/m$^3$ to 50 kg/m$^3$. The resulting expanded microspheres are mixed with an epoxy or silicone resin to obtain a composite material having a very low density. For instance, when expanded microspheres having a density of 30 kg/m$^3$ are mixed with the resin in a ratio by weight of 0.05, the density, $\rho$, of the resulting composite material is 380 kg/m$^3$ as calculated according to the foregoing equation (2). This density is much smaller than a density of a known composite material using glass beads. The composition material of this embodiment is very preferable for use as the acoustic impedance-matching layer. In general, thermally expanded microspheres are mixed with resin matrix in a ratio by volume of 0.15 to 0.65. Larger ratios are disadvantageous in handling or dispersing operations because of the too small a density of the microspheres.

As will be seen from FIGS. 6 and 8, composite materials comprising thermally expanded microspheres dispersed in a resin matrix have a very small sound velocity. However, as the sound velocity decreases, the wavelength of ultrasonic wave propagating through the composite material becomes shorter. The use of such composite materials of small sound velocity needs a very thin film in order to achieve a thickness of approximately a quarter wavelength. Such a thin layer is actually difficult to fabricate. For instance, when 3.3 wt% of thermally expanded microspheres are dispersed in silicone resin, the resulting composite material has a sound velocity of 450 m/sec. For application of the composite material as an acoustic impedance-matching layer of an ultrasonic transducer, it is needed to make a thin film with a thickness of about 0.11 mm at 1 MHz. Where expanded resin microspheres are mixed with a fluid synthetic resin, control of the sound velocity depends largely on the amount of expanded microspheres. More particularly, only a limited amount of expanded microspheres may be used in order to meet the sound velocity requirement but with a sacrifice of other necessary characteristics. In order to overcome the above, expanded resin microspheres are used in combination of at least one filler such as glass microballoons or carbon balloons which have a higher modulus of elasticity than the expanded resin microspheres. By the addition of the filler, the resulting composite material has a higher sound velocity than a composite material comprising expanded resin microspheres alone as filler when compared at the same level of the total filler content. The sound velocity and acoustic impedance of two composite materials comprising combinations of expanded resin microspheres and glass beads are shown in Table 2 below.

TABLE 2

| Filler | Sample No. 1 Expanded resin balloons | Sample No. 1 Glass beads | Sample No. 2 Expanded resin balloons | Sample No. 2 Glass beads |
|---|---|---|---|---|
| Content by wt. | 2.0% | 10% | 1.5% | 2.0% |
| Density ($kg/m^3$) | 590 | | 590 | |
| Sound velocity (m/s) | 505 | | 610 | |
| Acoustic impedance ($Ns/m^3$) | $0.30 \times 10^6$ | | $0.36 \times 10^6$ | |

It will be noted that the resin microballoons and the glass beads used each has an average size of 50 microns in diameter and silicone resin is used as the resin matrix. As will be seen from Table 2, the sound velocity increases with an increase of the content of the glass beads. When the composite material of Sample No. 2 is used as the acoustic impedance-matching layer for an ultrasonic wave of 1 MHz, the thickness of the layer is determined at about 0.15 mm. This is larger by about 36% than in the case where thermally expanded resin microballoons alone are used. However, when the content of the glass or carbon beads is increased, the acoustic impedance of the resulting composite mateial also increases, which is contrary to the purpose of the invention. Accordingly, the total content of thermally expanded resin microballoons having a size ranging from 10 to 100 microns and glass or carbon beads having a size ranging from 10 to 100 microns is in the range of 10 to 40 wt% based on the composite material. The ratio by weight of the resin microballoons to the beads is 0.02 to 0.2:1.

Figure 11:
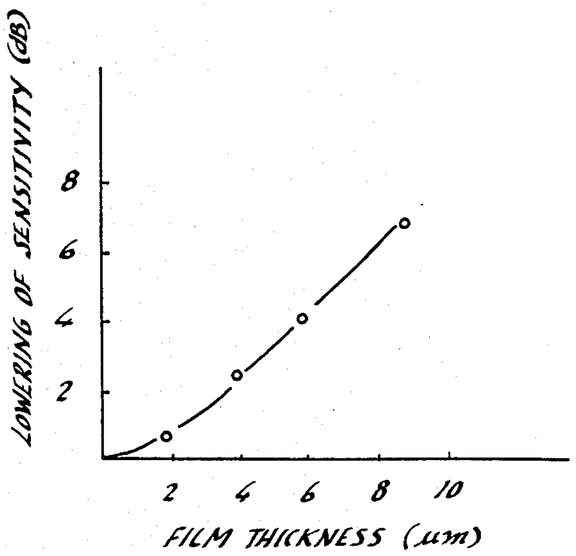
FIG. 11 is a graph showing the relation between loss of sensitivity and thickness of a protective film formed on a transducer arrangement.

As mentioned before, the protective layer 18 may be provided in order to prevent the transducer from suffering dirt or oil soiling, or mechanical damages by contact with other body. Especially, when a silicone resin is used as the matrix of the acoustic impedance-matching layer, it may be peeled off at the marginal portion thereof. This is avoided by providing a thin plastic film 18 over the entire acoustic-impedance layer 16 as shown in FIG. 2. It should be noted that the plastic film 18 is brought in intimate contact with the acoustic impedance-matching layer 16, for example, by the use of the keep frame 20 of FIG. 2. The plastic film 18 is made of polyethylene terephthalate, polypropylene, polyimide or the like. Preferably, the film thickness is up to 0.03 time the wavelength passed therethrough in order to avoid a significant lowering of the sensitivity of the transducer. In FIG. 11, there is shown the relation between film thickness and lowering of the sensitivity of the transducer. From the figure, it will be seen that the lowering of the sensitivity is below 6 dB if the film thickness is up to 9 microns which correspond to 0.03 time the wavelength passed through the layer. Once again, the intimate contact of the plastic film with the acoustic impedance-matching layer should be established without causing any air layer to be present therebetween. The presence of the air layer will considerably lower the sensitivity and transmission efficiency.

In order to further improve the sensitivity and band characteristics of transducers using one acoustic impedance-matching layers in high frequency ranges, it is preferable to provide another type of acoustic impedance-matching layer between the resin microballoon-containing layer and the transducer element.

Figure 12:
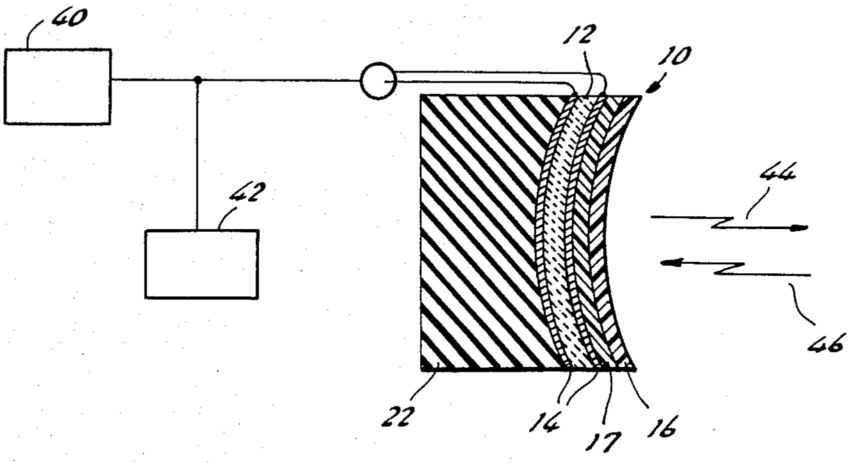
FIG. 12 is a still further embodiment of the invention comprising two impedance-matching layers in which the principle of transmitting an ultrasonic signal and receiving a reflected wave is also shown.

Reference is now made to FIG. 12 in which a transducer 10 of the concave type includes a transducer element 12, electrodes 14, an acoustic impedance-matching layer 16 (which is hereinafter referred to as second matching layer) and a backing member 22 similar to the transducer of FIG. 2. Another acoustic impedance-matching layer 17 (which is hereinafter referred to as first matching layer) is provided between one electrode 14 and the second matching layer 16.

In operation, the transducer is driven by a transmitter 40 to transmit an ultrasonic signal 44 into air and a reflected wave 46 is received by a receiver 42.

This type of transducer may be fabricated as follows, for example. The transducer element 12 is made of piezoelectric ceramic of PZT, and a metal coating is applied on opposite sides of the element 12 as electrodes 14. The first matching layer 17 of an epoxy resin having a thickness of approximately a quarter wavelength and an acoustic impedance of about $3 \times 10^6$ $Ns/m^2$ is bonded to one electrode as shown. To the layer 17 is further bonded the second matching layer 16 of approximately a quarter wavelength thickness which is obtained by having thermally expanded resin microballoons dispersed in silicone resin and which as an acoustic impedance of about $0.1 \times 10^6$ $Ns/m^3$. The transducer element 12 has on the back thereof the backing member 22 having an acoustic impedance of about $5 \times 10^6$ $Ns/m^3$ to give transducer A.

Figure 13:
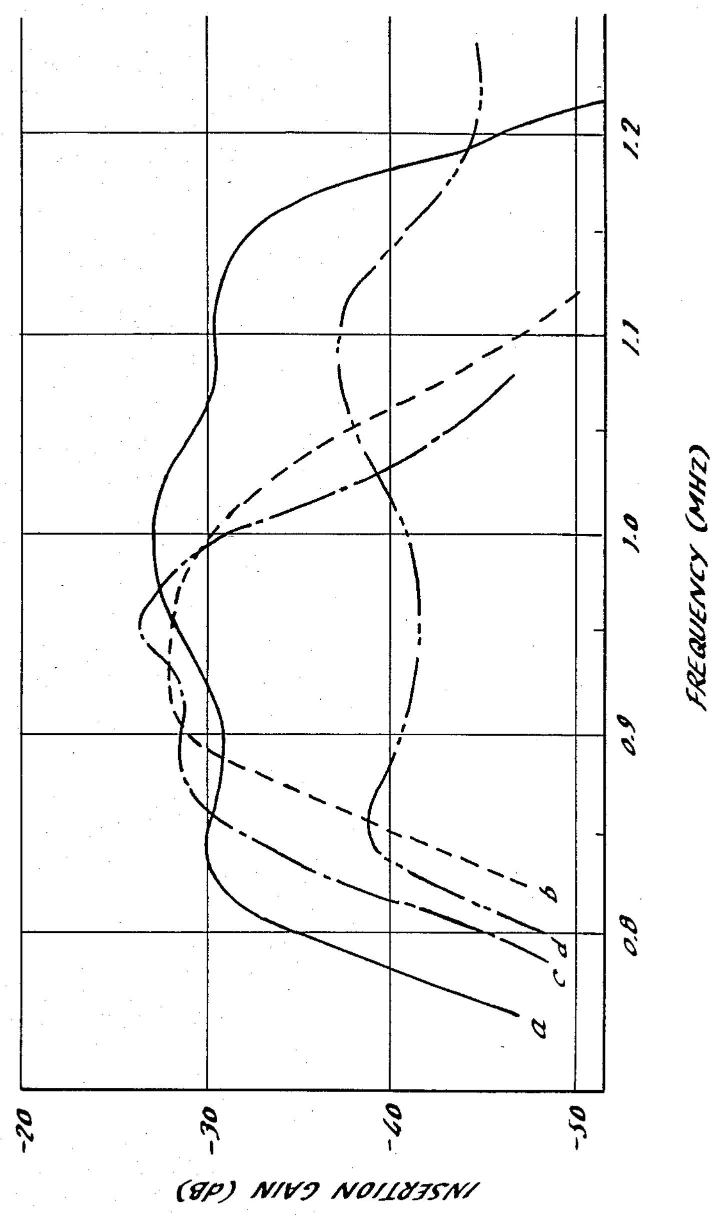
FIG. 13 is a graph showing the relation between insertion gain and frequency for different types of two-layers constructions.

The insertion gain of the thus fabricated ultrasonic transducer A is as shown by curve a in FIG. 13, revealing that the peak value is about $-27$ dB and the band width at $-6$ dB is about 0.34 MHz. Upon comparing, for example, with an ultrasonic transducer including one acoustic impedance-matching layer having an acoustic impedance of $3 \times 10^5$ $Ns/m^3$, the peak value is larger by about 7 dB and the band width at $-6$ dB is extended by about three times as greater. This ensues higher sensitivity and higher speed pulse response characteristic. If the transducer element 12 having a diameter of 50 mm and a focal length of 100 mm is driven to generate a high frequency of 1 MHz, the diameter of the ultrasonic beam is about 1 mm at the focal point with good azimuth resolution.

When the first matching layer 17 is made of each of materials having acoustic impedances of $1 \times 10^6$ $Ns/m^3$ and $6 \times 10^6$ $Ns/m^3$, the resulting transducers have an insertion gain characteristic as shown in curves b and c of FIG. 13, respectively. The fractional band width is as narrow as 0.15 to 0.18, meaning deterioration of distance resolution.

Thus, the insertion gain characteristic significantly varies by the combination of materials for the two acoustic impedance-matching layers. Proper selection of such materials is necessary.

The insertion gain characteristic may be also influenced by the acoustic impedance of the backing member 22. Ordinarily employed materials having an acoustic impedance ranging from 1 to $10\times10^6$ Ns/m$^3$ may be used.

When used in combination with the second matching layer 16 having an acoustic impedance of $0.3\times10^6$ Ns/m$^3$, the first matching layer 17 is preferred to have an acoustic impedance ranging from 4 to $6\times10^6$ Ns/m$^6$ and a thickness of one quarter wavelength. This range of acoustic impedance may be readily obtained by using an epoxy resin to which a powder of tungsten or silicon carbide having a size of 5 to 100 microns in an amount ranging from 10 to 50 wt% based on the resin. For instance, the layer 17 is made using an epoxy resin composition comprising 40 wt% of tungsten powder and the balance of the epoxy resin so that the acoustic impedance is $5\times10^6$ Ns/m$^3$. The insertion gain characteristic of the resulting transducer D using thus thus made layer 17 is as shown by curve d of FIG. 13. Although this transducer is lower in peak value than the foregoing transducers A and C, it has a good broadband characteristic and exhibits good distance resolution.

As will be apparent from the results of FIG. 13, proper combination of materials for the two acoustic impedance-matching layers is determined in view of the respective acoustic impedance values.

Assuming that the transducer using two matching layers is applied as an ultrasonic proximity sensor attached to robot or a distance sensor used in automatic assembling procedure, it would be necessary that a spatial position and shape of an object located at a distance of about 15 cm from the front surface of the transducer are determined by the use of an ultrasonic wave of 1 MHz in air.

The attenuation rate of the ultrasonic wave of 1 MHz in air is about 1.7 dB/cm. When the wave goes to and back an object separated from an ultrasonic wave-readiating surface by distance of 15 cm, about 51 dB is lost. On the other hand, the reflectivity for the ultrasonic wave of the object is allowed to an extent of −20 dB and the dynamic range of an ordinary ultrasonic transducer is about 110 dB, from which −40 dB is needed for the limit of the insertion gain characteristic of ultrasonic transducer. When the distance resolution, the ultrasonic beam shoud be focussed in a diameter of 1 mm, which corresponds to a value of about three times the wavelength, a fractional band width is preferred to have a value over 0.19.

The first and second layers in different acoustic impedances are tested for determining proper combinations of the two matching layers by measuring insertion gain characteristic and fractional band width. The results are shown in Table 3 below.

TABLE 3

| Acoustic Impedance ($\times 10^6$ Ns/m$^3$) First Layer | Acoustic Impedance ($\times 10^6$ Ns/m$^3$) Second Layer | IG (dB) | Fractional Band Width |
|---|---|---|---|
| 1.0 | 0.08 | −24 | 0.17 |
| 1.5 | 0.08 | −24 | 0.19 |
| 2.0 | 0.08 | −25 | 0.22 |
| 5.0 | 0.08 | −26 | 0.2 |
| 5.5 | 0.08 | −27 | 0.19 |
| 6.0 | 0.08 | −28 | 0.17 |
| 1.0 | 0.5 | −32 | 0.17 |
| 1.5 | 0.5 | −33 | 0.19 |
| 2.0 | 0.5 | −35 | 0.21 |
| 8.0 | 0.5 | −36 | 0.23 |
| 8.5 | 0.5 | −36 | 0.19 |
| 9.0 | 0.5 | −37 | 0.18 |
| 6.0 | 0.6 | −40 | 0.35 |
| 6.0 | 0.65 | −42 | 0.35 |

As will be clear from these results, when the acoustic impedance of the first acousic impedance-matching layer is smaller than $1.5\times10^6$ Ns/m$^3$, the fractional band width is small. On the other hand, the acoustic impedance of th second matching layer exceeding $0.6\times10^6$ Ns/m$^3$ is unfavorable because the insertion gain is lower than −40 dB. At present, it is not possible to lower the acoustic impedance of the second matching layer lower than $0.08\times10^6$ Ns/m$^3$.

Figure 14:
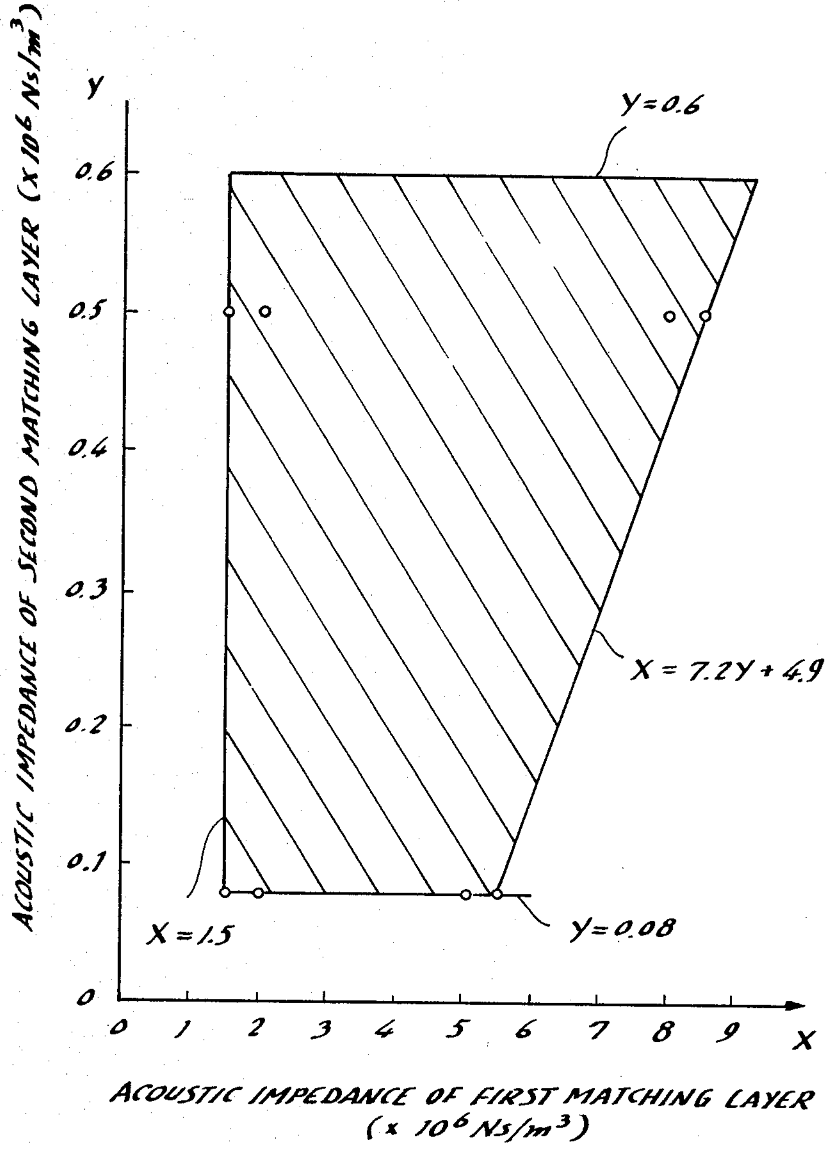
FIG. 14 is an illustrative view of optimum ranges of acoustic impedances of the two impedance-matching layers.

Based on these results, a preferable range of the acoustic impedances of the first and second matching layers lies in a region indicated by oblique lines of FIG. 14. In FIG. 14, the lower limit for the second matching layer is experimentally determined whereas the upper limit is determined such that the insertion gain characteristic is larger than about −40 dB. This region may be expressed by the following equations when the acoustic impedances of the first and second matching layers are taken as $X\times10^6$ Ns/m$^3$ and $Y\times10^6$ Ns/m$^3$, respectively, $$0.15 \leqq X \leqq 7.2Y + 4.9$$

$$0.08 \leqq Y \leqq 0.6$$

The combination of the first and second matching layers whose acoustic impedances satisfy the above equations will assures an ultrasonic transducer which is highly sensitive in high frequency regions and is able to transmit an ultrasonic wave and receive a reflected wave in good pulse response characteristic.

In FIG. 12, the transducer of the concave type has been illustrated, a flat or convex-shaped transducer may be likewise used. Needless to say, a thin plastic film may be applied to the second matching layer for protective purposes similar to the foregoing embodiments.

In the foregoing embodiments, the transducer is illustrated as transmitting an ultrasonic wave and receiving a reflected wave, but the acoustic impedance-matching layer or layers may be applied to separate transducers serving as a transmitter and a receiver, respectively.

What is claimed is:

1. An ultrasonic transducer comprising an ultrasonic transducer element, a pair of electrodes provided on opposite sides of said ultrasonic transducer element, and an acoustic impedance-matching layer formed on an ultrasonic wave-radiating surface of said ultrasonic transducer element through one electrode, said acoustic impedance-matching layer being made of a porous polymer film having a thickness of approximately a quarter wavelength or odd harmonics at the frequency generated from said transducer element and having an acoustic impedance not larger than $0.6\times10^6$ Ns/m$^3$.

2. The ultrasonic transducer according to claim 1, wherein said porous polymer film has a porosity of 50 to 90% and is made of a polyolefin.

3. The ultrasonic transducer according to claim 1, further comprising a protective film brought into intimate contact with said acoustic impedance-matching layer.

4. The ultrasonic transducer according to claim 1, further comprising a backing member bonded to a surface of said transducer element opposite to the ultrasonic wave radiation surface.

5. An ultrasonic transducer comprising an ultrasonic transducer element, a pair of electrodes provided on opposite sides of said ultrasonic transducer element, and an acoustic impedance-matching layer formed on an ultrasonic wave radiation surface of said ultrasonic transducer element through one electrode, said acoustic impedance-matching layer being made of a composite material of thermally expanded resin microballoons dispersed in a synthetic resin matrix, having a thickness of approximately a quarter wavelength or odd harmonics at the frequency generated from said transducer element and having an acoustic impedance not larger than $0.6\times10^6$ $Ns/m^3$.

6. The ultrasonic transducer according to claim 5, wherein said composite material comprises 15 to 65% by volume of the resin microballoons and the balance of the resin matrix.

7. The ultrasonic transducer according to claim 5, wherein the resin microballoons have a size ranging from 10 to 100 microns.

8. The ultrasonic transducer according to claim 5, further comprising hollow microspheres of at least one type which have a modulus of elasticity larger than that of the thermally expanded resin microballoons in an amount of 0.02 to 0.2 wt% based on the resin microballoons.

9. The ultrasonic transducer according to claim 8, wherein said hollow microballoons are made of glass or carbon.

10. The ultrasonic transducer according to claim 5, wherein the thermally expanded resin microballoons are dispersed in the resin matrix such that the size thereof decreases towards the direction of the interface between said acoustic impedance-matching layer and the electrode contacting therewith.

11. The ultrasonic transducer according to claim 5, wherein said resin matrix is a member selected from the group consisting of epoxy and silicone resins.

12. The ultrasonic transducer according to claim 5, further comprising a protective layer brought into intimate contact with said acoustic impedance-matching layer.

13. The ultrasonic transducer according to claim 12, wherein the protective layer is a thin plastic film.

14. An ultrasonic transducer comprising an ultrasonic transducer element, a pair of electrodes provided on opposite sides of said ultrasonic transducer element, a first acoustic impedance-matching layer formed on an ultrasonic wave radiation surface of said ultrasonic transducer element through one electrode, and a second acoustic impedance-matching layer formed on the first acoustic impedance-matching layer, the first and second acoustic impedance-matching layers having acoustic impedances defined by the following equations when the acoustic impedances of the first and second layers are, respectively, $X\times10^6$ $Ns/m^3$ and $Y\times10^6$ $Ns/m^3$, $1.5\leqq X\leqq 7.2Y+4.9$, and $0.08\leqq Y\leqq 0.6$ 15. The ultrasonic transducer according to claim 14, wherein the second acoustic impedance-matching layer is a porous polymer film having a thickness of approximately a quarter wavelength or odd harmonics at the frequency generated from said transducer element.

16. The ultrasonic transducer according to claim 15, wherein said porous polyme film is made of a polyolefin.

17. The ultrasonic transducer according to claim 15, further comprising a protective film brought into intimate contact with the second acoustic impedance-matching layer.

18. An ultrasonic transducer comprising an ultrasonic transducer element, a pair of electrodes provided on opposite sides of said ultrasonic transducer element, a first acoustic impedance-matching layer formed on an ultrasonic wave radiation surface of said ultrasonic transducer element through one electrode, and a second acoustic impedance-matching layer formed on the first acoustic impedance-matching layer, the first and second acoustic impedance-matching layers having acoustic impedances defined by the following equations when the acoustic impedances of the first and second layers are, respectively, $X\times10^6$ $Ns/m^3$ and $Y\times10^6$ $Ns/m^3$, $1.5\leqq X\leqq 7.2Y+4.9$, and $0.08\leqq Y\leqq 0.6$, the second acoustic impedance-matching layer being made of a composite material of thermally expanded microballoons dispersed in a synthetic resin matrix.

19. The ultrasonic transducer according to claim 18, wherein said composite material further comprises at least one type of microballoons which have a modulus of elasticity larger than said thermally expanded resin microballoons.

20. The ultrasonic transducer according to claim 19, wherein said at least one type of microballoons are glass or carbon balloons and are used in an amount of 0.02 to 0.2 wt% based on said thermally expanded resin microballoons.

21. The ultrasonic transducer according to claim 18, wherein the first and second acoustic impedance-matching layers have each a thickness of approximately a quarter wavelength or odd harmonics at the frequency generated from said transducer element.

22. The ultrasonic transducer according to claim 18, wherein the first acoustic impedance-matching layer is made of a cured epoxy resin.

23. The ultrasonic transducer according to claim 18, wherein the first acoustic impedance-matching layer is made of a cured epoxy resin dispersing therein powder of tungsten or silicon carbide.

24. The ultrasonic transducer according to claim 18, the synthetic resin matrix is a cured epoxy or silicone resin.

25. The ultrasonic transducer according to claim 18, further comprising a protective film brought into intimate contact with the second acoustic impedance-matching layer.

26. The ultrasonic transducer according to claim 25, wherein said protective layer is a thin plastic film.

* * * * *